United States Patent [19]

Iwamoto et al.

[11] Patent Number: 4,857,115
[45] Date of Patent: Aug. 15, 1989

[54] PHOTOVOLTAIC DEVICE

[75] Inventors: Masayuki Iwamoto, Itami; Kouji Minami, Higashiosaka; Kaneo Watanabe, Yawata, all of Japan

[73] Assignee: Sanyo Electric Co., Ltd., Japan

[21] Appl. No.: 190,137

[22] Filed: May 4, 1988

[30] Foreign Application Priority Data

May 15, 1987 [JP] Japan .............................. 62-73152[U]

[51] Int. Cl.$^4$ ............................................. H01L 31/06
[52] U.S. Cl. ................................... 136/249; 136/258; 357/30; 357/59
[58] Field of Search .................. 136/249 TJ, 258 AM; 357/30 J, 30 K, 59 C

[56] References Cited

U.S. PATENT DOCUMENTS 4,496,788  1/1985  Hamakawa et al. ................. 136/249
4,799,968  1/1989  Watanabe et al. .................... 136/258

OTHER PUBLICATIONS

K. Takahashi et al., "Amorphous Silicon Solar Cells," John Wiley & Sons, New York (1986), pp. 109–119, 144–148, and 180.

*Primary Examiner*—Aaron Weisstuch
*Attorney, Agent, or Firm*—Darby & Darby

[57] ABSTRACT

The present invention relates to a photovoltaic device using hydrogenated amorphous silicon as a photoactive layer, wherein the ratio of the number of silicon atoms bonded to hydrogen atoms to the total number of silicon atoms (expressed as a percentage) is 1% or less and the density of dangling bonds is $1 \times 10^{17}$ cm$^{-3}$ or less. Accordingly, the device of the present invention has the following advantages: the cost can be reduced by forming a thinner layer, the area of the photo-active layer can be increased, the efficiency of photo-electric conversion is improved, and photo-deterioration is reduced.

11 Claims, 2 Drawing Sheets

PHOTOVOLTAIC DEVICE

BACKGROUND OF THE INVENTION

1. Field of the Invention

The present invention relates to a photovoltaic device for use as a solar cell, photosensor or the like. The photovoltaic device uses hydrogenated amorphous silicon semiconductor as a photo-active layer for which hydrogen is added to silicon.

2. Description of the Prior Art

A photovoltaic device is constructed in such a manner that a front electrode, a power generating element and a back electrode are deposited in this order on an insulative and light-transmissible substrate. If light is incident on the device from the substrate side, a photo-active layer of the power generating element absorbs part of the light and generates a photo-voltage, and the generated photo-voltage is outputted.

Photovoltaic devices which use hydrogenated amorphous silicon semiconductor as a photo-active layer are well known. Hydrogenated amorphous silicon excels in thin film performance in comparison with single crystalline silicon, and therefore the area of the photo-active layer can be made larger while maintaining the same mass, resulting in an effective reduction in the cost. Thus, utilization of hydrogenated amorphous silicon in large-scaled solar cells is being promoted.

However, the photovoltaic device using hydrogenated amorphous silicon has problems in that the efficiency of photoelectric conversion is low in comparison with the photovoltaic device using single crystalline silicon semiconductor, and photo-deterioration (i.e. the efficiency of photoelectric conversion is reduced by intense light irradiation) is likely to occur (Japanese Patent Publication Laid-Open No. sho-54274/1984).

SUMMARY OF THE INVENTION

The present invention has been achieved in order to solve the problems as described above. In the present invention, hydrogenated amorphous silicon has a number of silicon atoms bonded to hydrogen atoms (expressed as a percentage) that is 1% or less of the total number of silicon atoms and the concentration or density of the dangling bonds of the silicon atoms is $1 \times 10^{17}$ cm$^{-3}$ or less is used as a photo-active layer.

Accordingly, a first object of the present invention is to provide a photovoltaic device with reduced photo-deterioration by increasing the absorption coefficient and thereby reducing the film thickness.

A second object of the present invention is to provide a photovoltaic device with enhanced efficiency of photoelectric conversion by reducing the optical band gap of the photo-active layer and thereby increasing the absorption coefficient of light in the long-wavelength region.

The above further objects and features of the invention will be more fully apparent from the following detailed description with accompanying drawings.

DESCRIPTION OF THE PREFERRED EMBODIMENTS

Figure 1:
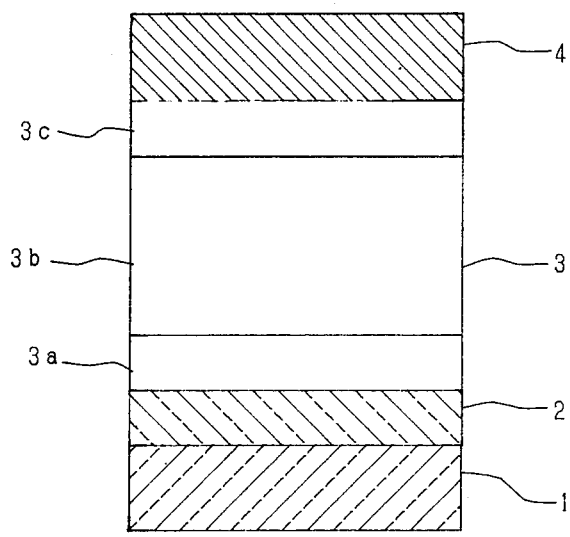
FIG. 1 is a schematic cross-sectional view showing a basic structure of a photovoltaic device in accordance with the present invention.

FIG. 1 shows a basic structure of a photovoltaic device of the present invention. The example as shown in FIG. 1 is of a single cell. In FIG. 1, an insulative and light-transmissible substrate 1 consists of transparent glass. On the substrate 1, a front electrode 2 consisting of a TCO typified by SnO$_2$, In$_2$O$_3$, or ITO (a mixture of SnO$_2$ and In$_2$O$_3$), a metal thin film such as Au, Al, Ni, or Cr, or a metal grid of Al, Ni, Cr or the like, a power generating element 3 having a PIN type semiconductor junction as described later, and a back electrode 4 consisting of Al are deposited in this order.

The power generating element 3 has a three-layer structure consisting of a P-type amorphous SiC:H layer 3a (film composition: Si 90 Mol%, C 10 Mol%, film thickness: 150 Å), an I-type amorphous Si:H layer 3b (film thickness: 2000 Å, and an N-type amorphous Si:H layer 3c (film thickness: 300 Å)) in this order from the front electrode 2 side. In the present invention, for the I-type amorphous Si:H layer (photo-active layer) 3b, the ratio of silicon atoms bonded to hydrogen atoms to the total number of silicon atoms is 1% or less, and the density of dangling bonds of the silicon atoms is $1 \times 10^{17}$ cm$^{-3}$ or less.

Next, description is made of a method of manufacturing a photovoltaic device having such a structure. The front electrode 2 is formed, for example, by evaporating SnO$_2$ onto the substrate 1. Subsequently, the P-type amorphous SiC:H layer 3a is formed on the front electrode 2 by the plasma CVD method utilizing radio frequency glow discharge. The I-type amorphous Si:H layer 3b is formed on the P-type amorphous SiC:H layer 3a by the excited radical CVD method or photo-CVD method. The N-type amorphous Si:H layer 3c is formed on the I-type, amorphous Si:H layer 3b by the plasma CVD method employing radio frequency glow discharge. The following Table 1 shows one example of reaction conditions for forming each of these three layers. Finally, the back electrode 4 is formed by evaporating Al onto the N-type amorphous Si:H layer 3c.

TABLE 1

|  | 3a<br>P—a—SiC:H | 3b<br>I—a—Si:H | 3c<br>N—a—Si:H |
| --- | --- | --- | --- |
| Reaction method | Glow discharge method | Excited radical CVD method | Glow discharge method |
| Applied power (W) | Radiofrequency (13.56 MHz)<br>30 | Microwave (2.45 GHz)<br>100 | Radiofrequency (13.56 MHz)<br>30 |
| Temperature of substrate (°C.) | 200 | 300 | 200 |
| Pressure (Torr) | 0.3 | 0.001 | 0.3 |
| Reaction gas ratio | CH$_4$/SiH$_4$ = 1<br>B$_2$H$_6$/SiH$_4$ = 0.01 | SiH$_2$F$_2$/H$_2$ = 0.1 | PH$_3$/SiH$_4$ = 0.1 |

Figure 2:
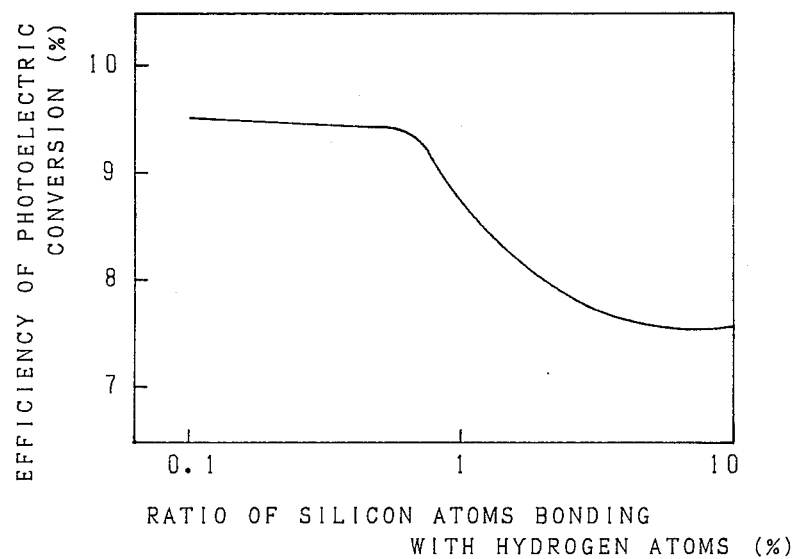
FIG. 2 is a graph showing the relationship between the ratio of silicon atoms bonded with hydrogen atoms and the efficiency of photoelectric conversion.
Figure 3:
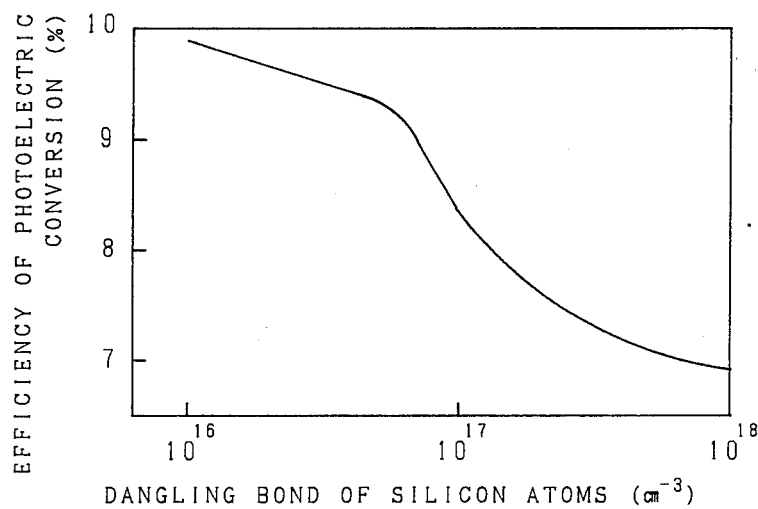
FIG. 3 is a graph showing the relationship between the dangling bonds of the silicon atoms and the efficiency of photoelectric conversion.

Next, description is made of the percent of silicon atoms bonded to hydrogen atoms and the number of dangling bonds of the silicon atoms. FIG. 2 is a graph showing the relationship between the ratio of silicon atoms bonding with hydrogen atoms and the efficiency of photoelectric conversion. The abscissa represents the ratio (%) of silicon atoms bonded with hydrogen atoms. The ordinate represents the efficiency of photoelectric conversion (%). In addition, the graph shows the relationship between them in the case where the density of dangling bonds in $5 \times 10^{16}$ cm$^{-3}$ and the condition of irradiation is AM-1,100 mW/cm$^2$. Also, FIG. 3 shows the relationship between the number of dangling bonds of the silicon atoms and the efficiency of photoelectric conversion, and the abscissa represents the density of dangling bonds (cm$^{-3}$) and the ordinate represents the efficiency of photoelectric conversion (%). In addition, the graph shows the relationship between them in the case where the ratio of silicon atoms bonded to hydrogen atoms is 0.5% and the condition of irradiation is AM-1,100 mW/cm$^2$.

As is understood from FIG. 2, when the ratio of silicon atoms bonding with hydrogen atoms exceeds 1%, the efficiency of photoelectric conversion is suddenly reduced. Accordingly, it is preferable that the percent of silicon atoms bonded to hydrogen atoms is 1% or less. Also, as is understood from FIG. 3, when the density of dangling bonds of the silicon atoms exceeds $1 \times 10^{17}$ cm$^{-3}$, the efficiency of photoelectric conversion is suddenly reduced. Accordingly, the density of the dangling bonds of the silicon atoms is preferably $1 \times 10^{17}$ cm$^{-3}$ or less. Accordingly, the photovoltaic device using hydrogenated amorphous silicon semiconductor as a photo-active layer wherein the percent of silicon atoms bonded to hydrogen atoms is 1% or less and the density of dangling bonds of the silicon atoms is $1 \times 10^{17}$ cm$^{-3}$ or less has a high efficiency of photoelectric conversion.

The following Table 2 shows the characteristics of the I-type amorphous Si:H layer of the present invention and the conventional I-type amorphous Si:H layer. The following Table 3 shows the photoelectric conversion characteristics of a photovoltaic device of the present invention and a photovoltaic device having the conventional I-type amorphous Si:H layer as shown in Table 2. In addition, the numerical values shown in Table 3 show characteristics in the case where the condition of irradiation is AM-1, 100 mW/cm$^2$ for both of the photovoltaic devices.

TABLE 2

|  | Example of present invention | Conventional example |
| --- | --- | --- |
| Ratio of silicon atoms bonded to hydrogen atoms (%) | 0.5 | 20 |
| Density of dangling bond of silicon atoms (cm$^{-3}$) | $5 \times 10^{16}$ | $1 \times 10^{16}$ |
| Optical band gap (eV) | 1.60 | 1.70 |
| Absorption coefficient at 700 nm (cm$^{-1}$) | $3 \times 10^4$ | $7 \times 10^3$ |
| Photo conductivity $\sigma$ph ($\Omega^{-1}$cm$^{-1}$) | $2 \times 10^{-5}$ | $1 \times 10^{-5}$ |
| Dark conductivity $\sigma$d ($\Omega^{-1}$cm$^{-1}$) | $5 \times 10^{-11}$ | $1 \times 10^{-11}$ |

TABLE 3

|  | Example of present invention | Conventional example |
| --- | --- | --- |
| Short-circuit current Isc (mA/cm$^2$) | 17.2 | 14.5 |
| Open-circuit voltage Voc | 0.84 | 0.85 |

TABLE 3-continued

|  | Example of present invention | Conventional example |
| --- | --- | --- |
| (V) |  |  |
| Fill factor FF | 0.65 | 0.68 |
| Efficiency of photoelectric conversion $\eta_0$ (%) | 9.39 | 8.38 |
| Efficiency of photoelectric conversion after irradiation at 100 mW/cm$^2$ for 100 hrs $\eta$ (%) | 8.64 | 6.79 |
| $\eta/\eta_0$ | 0.92 | 0.81 |

For the conventional device, the efficiency of photoelectric conversion is 8.38%, while it is 9.39% for the present invention, a difference of 1% or more. Also, the rate of reduction in the efficiency of photoelectric conversion after irradiation of intense light rays is 19% for the conventional device, while it is only 8% for the present invention, and thereby photo-deterioration is reduced.

In the photovoltaic device of the present invention, as shown in Table 2, the optical band gap of the I-type amorphous Si:H layer is reduced and the absorption coefficient of the long-wavelength region is increased, and therefore light of long-wavelengths not utilized effectively in the conventional device can be used for a photo-voltage, and thereby the photoelectric conversion characteristics are improved as shown in Table 3. Also, as shown in the above-mentioned Table 2, the absorption coefficient at 700 nm is increased up to $3 \times 10^4$ cm$^{-1}$, and therefore the film thickness previously required to be about 4000~5000 Å can be reduced to 3000 Å or less, preferably 2000 Å or less, and thereby the photo-deterioration can be reduced.

As detailed above, in accordance with the photovoltaic device of the present invention, the efficiency of photoelectric conversion can be enhanced and the photo-deterioration can be reduced.

Photovoltaic devices of so-called tandem structure (U.S. Pat. No. 4,496,788) are well known. Such devices have power generating elements deposited in a multi-layered fashion such as in double, triple or more layers. In such tandem cells, the efficiency of photoelectric conversion can be enhanced by adjusting the optical band gap in each power generating element.

Next, description is made of a second embodiment in accordance with the present invention, that is, the tandem cells as described above.

Figure 4:
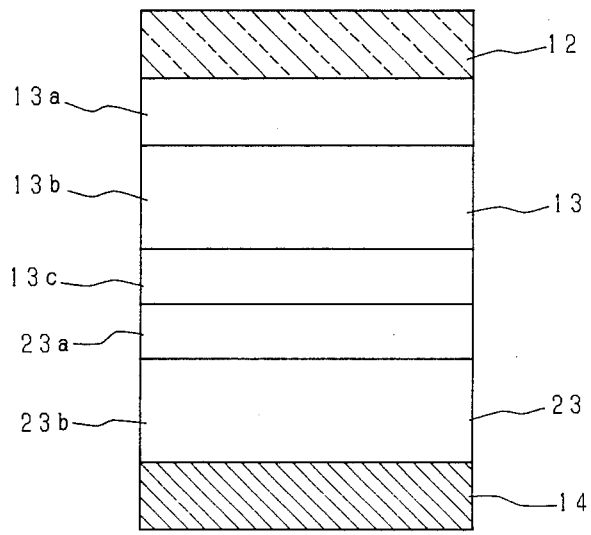
FIG. 4 is a schematic cross-sectional view showing a basic structure of another embodiment of a photovoltaic device in accordance with the present invention.

FIG. 4 shows a basic structure of the embodiment of the tandem cells of the present invention. When viewed from the incident light side, arranged on the front electrode consisting of TCO, is a first power generating element 13. This first power generating element 13 has a PIN-type three-layered structure of 13a, 13b and 13c arranged, in this order, from the front electrode 12 side. A second power generating element having a P-N type semiconductor junction between layers 23a and 23b is arranged, in this order from the front electrode 12 side, on a back electrode 14. The back electrode 14 is composed of Ti which has a high melting point and excels in ohmic contacting with the N-type semiconductor layer 23b. Each of the first and the second power generating elements 13 and 23 individually functions as a power generating element. The following Table 4 shows various possible film configurations of the first and the second power generating elements 13 and 23.

In addition, in the present invention, in the I-type amorphous layer (photo-active layer) 13b, the ratio of silicon atoms bonded with hydrogen atoms to the total number of silicon atoms is 1% or less, and the density of dangling bonds of the silicon atoms is $1 \times 10^{17}$ cm$^{-3}$ or less.

TABLE 4

|  | Film composition | Optical band gap (eV) | Film thickness (Å) |
|---|---|---|---|
| 13a | P—type a—SiC:H | ~2.0 | ~200 |
|  | P—type a—Si:H | ~1.7 | ~150 |
|  | P—type μC—Si:H | ~2.0 | ~200 |
| 13b | Low-hydrogenated a—Si:H | ~1.6 | ~1000 |
| 13c | N—type a—Si:H | ~1.7 | ~70 |
|  | N—type μC—Si:H | ~2.0 | ~70 |
| 23a | P—type a—SiC:H | ~2.0 | ~80 |
|  | P—type a—Si:H | ~1.7 | ~80 |
|  | P—type μC—Si:H | ~2.0 | ~80 |
|  | P—type poly—Si | ~1.2 | ~3000 |
| 23b | N—type poly—Si | ~1.2 | ~100000 |

Table 4 shows examples of possible configurations of P-I-N type and P-N type in this order from the front electrode 12 side; however, it is noted that, in reverse, a configuration of N-I-P type and N-P type in this order from the front electrode 12 side can be used, and in this case, the back electrode 14 is preferably Pt.

Table 5 shows photoelectric conversion characteristics of the photovoltaic device of tandem structure in accordance with the present invention. In addition, embodiment (a) in Table 5 has a film configuration of P-type a-SiC:H (13a), I-type low-hydrogenated a-Si:H (13b), N-type μC-Si:H (13c), P-type poly-Si (23a) and N-type poly-Si (23b) in this order from the front electrode 12, and embodiment (b) has a film configuration of N-type a-SiC:H (13a), I-type low-hydrogenated a-Si:H (13b), P-type μC-Si:H (13c), N-type poly-Si (23a) and P-type poly-Si (23b) in this order from the front electrode 12 side. In addition, numerical values shown in Table 5 show characteristics in the case where the condition of irradiation is AM-1,100 mW/cm$^2$ for both photovoltaic devices.

TABLE 5

|  | Embodiment (a) | Embodiment (b) |
|---|---|---|
| Short-circuit current $I_{sc}$ (mA/cm$^2$) | 12.2 | 14.5 |
| Open-circuit voltage $V_{oc}$ (V) | 1.5 | 1.5 |
| Fill factor FF | 0.68 | 0.70 |
| Efficiency of photoelectric conversion $\eta_0$ (%) | 12.4 | 15.2 |
| Efficiency of photoelectric conversion after irradiation at 100 mW/cm$^2$ for 100 hrs $\eta$ (%) | 11.4 | 14.0 |
| $\eta/\eta_0$ | 0.92 | 0.92 |

As is understood from Table 5, in the photovoltaic device of tandem cells of the present invention, photoelectric conversion characteristics are improved.

In addition, in the above-described embodiment of tandem cells, the second power generating element uses poly crystalline silicon as a main constituent. In addition to the above-described embodiment, embodiments may be formed for which the second power generating element uses amorphous silicon as a main constituent, or the second power generating element uses single crystalline silicon as a main constituent.

Description as been made of a configuration with two power generating elements, but a configuration with three or more power generating elements may be adopted.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A photovoltaic device comprising a front electrode, a power generating element whose main constituent is amorphous silicon, and a back electrode arranged in this order, said power generating element having a photo-active layer which comprises hydrogenated amorphous silicon wherein the ratio of the number of silicon atoms bonded to hydrogen atoms to the total number of silicon atoms expressed as a percentage is at most 1%, and the density of dangling bonds of the silicon atoms is at most $1 \times 10^{17}$ cm$^{-3}$, said photo-active layer having a conductivity type that is substantially I-type.

2. A photovoltaic device in accordance with claim 1, wherein the conductivity types of said power generating element are P, I and N in this order from said front electrode side.

3. A photovoltaic device in accordance with claim 1, wherein the conductivity types of said power generating device are N, I and P in this order from said front electrode side.

4. A photovoltaic device comprising a front electrode, a first power generating element whose main constituent is amorphous silicon, a second power generating element, and a back electrode arranged in this order, said first power generating element having a photo-active layer of which comprises hydrogenated amorphous silicon wherein the ratio of the number of silicon atoms bonded to hydrogen atoms to the total number of silicon atoms expressed as a percentage is at most 1%, and the density of dangling bonds of the silicon atoms is at most $1 \times 10^{17}$ cm$^{-3}$, said photo-active layer having a conductivity type that is substantially I-type.

5. A photovoltaic device in accordance with claim 4, wherein said second power generating element comprises polycrystalline silicon.

6. A photovoltaic device in accordance with claim 5, wherein the conductivity types of said first and second power generating elements are P, I, N and P, N, respectively, in this order from said front electrode side.

7. A photovoltaic device in accordance with claim 5, wherein the conductivity types of said first and second power generating elements are N, I, P and N, P, respectively, in this order from said front electrode.

8. A photovoltaic device in accordance with claim 4, wherein said second power generating element comprises amorphous silicon.

9. A photovoltaic device in accordance with claim 4, wherein said second power generating element comprises single crystalline silicon.

10. A photovoltaic device comprising a front electrode, a power generating element comprising amorphous silicon, and a back electrode, wherein said power generating element comprises a photo-active layer contributing to power generation, and said photo-active layer comprises hydrogenated amorphous silicon semiconductor whose absorption coefficient at 700 nm is at least about $3 \times 10^4$ cm$^{-1}$, said photo-active layer having a conductivity type that is substantially I-type.

11. A photovoltaic device in accordance with claim 10, wherein the thickness of said photo-active layer is 3000 Å or less.

* * * * *

UNITED STATES PATENT AND TRADEMARK OFFICE
CERTIFICATE OF CORRECTION

PATENT NO. : 4,857,115
DATED : AUGUST 15, 1989
INVENTOR(S) : IAWMOTO ET AL.

It is certified that error appears in the above-identified patent and that said Letters Patent is hereby corrected as shown below:

Column 6, line 10 insert --are-- between "electrode"and "arranged".

Column 6, line 31 insert --are-- between "electrode" and "arranged".

Signed and Sealed this

Seventeenth Day of July, 1990

Attest:

HARRY F. MANBECK, JR.

*Attesting Officer*  *Commissioner of Patents and Trademarks*